(12) United States Patent  (10) Patent No.: US 6,700,193 B2
Shimanuki  (45) Date of Patent: Mar. 2, 2004

(54) SEMICONDUCTOR PACKAGE WITH ELEVATED TUB

(75) Inventor: Yoshihiko Shimanuki, Nanyo (JP)

(73) Assignees: Renesas Technology Corporation, Tokyo (JP); Hitachi Yonezawa Electronics Co., Ltd., Yamagata (JP)

(*) Notice: Subject to any disclaimer, the term of this patent is extended or adjusted under 35 U.S.C. 154(b) by 0 days.

(21) Appl. No.: 09/988,645

(22) Filed: Nov. 20, 2001

(65) Prior Publication Data

US 2002/0079563 A1 Jun. 27, 2002

(30) Foreign Application Priority Data

Dec. 25, 2000 (JP) .......................................... 2000-391890

(51) Int. Cl.[7] .............................................. H01L 23/48
(52) U.S. Cl. ......................... 257/693; 257/690; 257/678
(58) Field of Search ................................. 257/666, 693, 257/678, 670, 676, 787, 690; 438/123–127, 461; 361/400, 401, 707

(56) References Cited

U.S. PATENT DOCUMENTS 5,942,794 A * 8/1999 Okumura et al. ........... 257/666

2001/0041424 A1 * 11/2001 Matsuura et al. ........... 438/461

FOREIGN PATENT DOCUMENTS

JP 11-74440 3/1999

* cited by examiner

Primary Examiner—Eddie Lee
Assistant Examiner—Douglas W. Owens
(74) Attorney, Agent, or Firm—Mattingly, Stanger & Malur, P.C.

(57) ABSTRACT

The semiconductor device includes
  tub 5 that is smaller than semiconductor chip 8, and which supports semiconductor chip 8;
  molded section 12 that is formed by resin-molding around semiconductor chip 8;
  suspension leads 4, including supporting portions 4a that support tub 5 and exposed portions 4b that are connected to supporting portions 4a and are exposed on back surface 12a of molded section 12, and are elevation processed in supporting portions 4a;
  leads 2 that are located around tub 5; and
  wires 10 that connect pads 7 of semiconductor chip 8 with the corresponding leads 2;
wherein the thickness of tub 5 and supporting portions 4a of suspension leads 4 is less than the thickness of exposed portions 4b, and back surface 8b of semiconductor chip 8 is firmly in contact with molding resin 11.

2 Claims, 16 Drawing Sheets

SEMICONDUCTOR PACKAGE WITH ELEVATED TUB

BACKGROUND OF THE INVENTION

This invention relates to semiconductor manufacturing technology, and in particular to an effective technology that is applicable to improving temperature-cycling characteristics.

In recent years, higher densities of mounting have been accompanied by a requirement for more compact and thinner semiconductor products. As a technology in response to this requirement, Patent Official Gazette 11-74440 discloses a resin-molded type semiconductor device and a method for manufacturing it in which the tub on which the semiconductor chip is mounted is elevation processed (processed to elevate the tub).

In the semiconductor device described in Patent Official Gazette 11-74440, the leads are located at the periphery of the back surface (semiconductor device mounting surface) of a molded section, the tub is set higher than the leads by bending the suspension leads, and molding resin is provided on the back surface of the tub. Accordingly, the tub is embedded in molding resin, thus achieving high degrees of reliability and thinness.

SUMMARY OF THE INVENTION

However, in a semiconductor device in the configuration described in Patent Official Gazette 11-74440, although molding resin is provided on the back surface of the tub, the tub is lifted by bending of the suspension leads alone (elevation processing). As a result, a step is generated between the leads and the tub, and the chip is set higher.

Therefore, the semiconductor device described in Patent Official Gazette 11-74440 is not capable of achieving sufficient thinness.

If the molding resin on the back surface of the tub is made thinner or eliminated (tub-exposed configuration), the balance between the molding resin above and below the semiconductor chip (resin balance) deteriorates. Applying temperature cycling to such a semiconductor device causes cracks in its package.

One objective of this invention is to provide a semiconductor device such that cracking of its package is prevented and a method of manufacturing this device.

Another objective of this invention is to provide a semiconductor device and a method for manufacturing it that achieves thinness while maintaining the balance between the resin above and below the semiconductor chip.

The objectives and novel features of this invention will be clarified by the following description of its specifications and by the accompanying drawings.

A typical example of the invention disclosed in this application is briefly summarized in the following passage.

A semiconductor device of this invention comprises:
a tub that supports a semiconductor chip;
a molded section that is formed by molding resin around the semiconductor chip;
suspension leads, including a supporting portion that supports the tub and an exposed portion that is connected to the supporting portion and is exposed at the surface of the molded section where the semiconductor device is mounted, that are processed so that the supporting portion is elevated;
leads that are placed around the tub and are exposed at the surface of the molded section where the semiconductor device is mounted; and
thin metal wires that connect the electrodes of the semiconductor chip with the corresponding leads;
wherein the tub and the supporting portions of the suspension leads are thinner than the exposed portion, and the major surface and part of the opposite surface of the semiconductor chip are in firm contact with the molding resin.

This invention makes a thicker molded section below the back surface of the tab possible, it thus eliminates differences in thickness between the molded sections above (major surface) and below (back surface) the semiconductor chip. Therefore, the balance between the amounts of molding resin above and below the semiconductor chip (resin balance) can be improved, and reduces the amount of stress applied to the embedded sections below the semiconductor chip during temperature cycling.

In addition, since part of the back surface of the semiconductor chip is in firm contact with the molding resin, it is possible to improve the degree of adhesion between the semiconductor chip and the molding resin on the back surface of the semiconductor chip. Cracking of the package can thus be prevented since the balance between the amounts of resin above and below the semiconductor chip is improved as is the degree of adhesion, on the back surface of the semiconductor chip, between the semiconductor chip and the molding resin; the device's temperature-cycling characteristics are thus improved.

A semiconductor device of this invention is comprised of:
a tub as a supporting part for the opposite surface of the major surface of a semiconductor chip;
a molded section formed by resin-molding around the semiconductor chip;
suspension leads, including supporting portions that support the tub and exposed portions that are connected to the supporting portions and are exposed on the surface of the molded section within which the semiconductor device is mounted, and being deformed so that the supporting portion is displaced away from the exposed surface of the exposed portion;
leads that are located around the tub and are exposed on the surface of the molded section within which the semiconductor device is mounted; and
thin metal wires that connect the electrodes of the semiconductor chip with the corresponding leads;
wherein the tub and the supporting portions of the suspension leads are thinner than the exposed portion, and the major surface and part of the opposite surface of the semiconductor chip are firmly in contact with the molding resin.

A semiconductor device of this invention comprises:
a tub smaller than a semiconductor chip, which supports the semiconductor chip;
a molded section formed by resin-molding around the semiconductor chip;
suspension leads, including supporting portions that support the tub and an exposed portion that is connected to the supporting portion and is exposed at the surface of the molded section where the semiconductor device is mounted, that are processed so that the supporting portion is elevated;
leads that are located around the tub and are exposed to the semiconductor device mounting surface of the molded section; and thin metal wires that connect the electrodes of the semiconductor chip with the corresponding leads;

wherein the tub and the supporting portions of the suspension leads are thinner than the exposed portion, and the major surface and part of the opposite surface of the semiconductor chip are firmly in contact with the molding resin.

A method of manufacturing a semiconductor device of this invention is comprised of the steps of:

forming a leadframe which has a tub to support a semiconductor chip, suspension leads that include supporting portions which support the tub and exposed portions that are connected to the supporting portions—the supporting portions of which are upset—processed, and leads that are located around the tub, where the tub and supporting portions are made thinner than the exposed portions;

bonding the tub and semiconductor chip;

using thin metal wires to connect the electrodes of the semiconductor chip with the corresponding leads;

forming a molded section where molding resin is provided on the surface opposite the chip-supporting portion of the tub, the major surface and part of the opposite surface of the semiconductor chip are firmly brought into contact with the molding resin, the leads and the exposed portions of the suspension leads are on the same surface as the mounting for the semiconductor device, and resin-molding is around the semiconductor chip; and separating the leads and the suspension leads, at the exposed portions of the suspension leads, from the frame portion of the leadframe.

A method of manufacturing a semiconductor device of this invention is comprised of the steps of:

forming a leadframe which has a tub to support a semiconductor chip, suspension leads that include supporting portions which support the tub and exposed portions which are connected to the supporting portions—the suspension leads are deformed to displace the chip-supporting portion away from the surface where the exposed portions are exposed, and leads that are located around the tub, where the tub and supporting portions are made thinner than the exposed portions;

bonding the tub to part of the surface of the semiconductor chip that is opposite the chip's major surface;

using thin metal wires to connect the electrodes of the semiconductor chip with the corresponding leads;

forming a molded section where molding resin is provided on the surface opposite the chip-supporting portion of the tub, the major surface and part of the opposite surface of the semiconductor chip are firmly brought into contact with the molding resin, the leads and the exposed portions of the suspension leads are on the same surface as the mounting for the semiconductor device, and resin-molding is around the semiconductor chip; and separating the leads and the suspension leads, at the exposed portions of the suspension leads, from the frame section of the leadframe.

A semiconductor device of this invention is comprised of:

a chip-mounting portion with major and back surfaces;

supporting leads with major and back surfaces, which are linked to the chip-mounting section;

leads located around the chip-mounting section;

a semiconductor chip with a major surface on which the semiconductor elements and bonding pads are formed and a back surface (opposite surface) that is made to adhere to the surface of the chip-mounting section;

bonding wires that electrically connect the bonding pads and the leads; and resin on the upper and back (opposite) surfaces, which is molded around the chip-mounting portion, the supporting leads, the leads, the semiconductor chip, and the bonding wires;

wherein parts of the leads are exposed on the back surface of the resin;

the chip-mounting portion is smaller than the semiconductor chip;

the chip-mounting portion is shallower than the leads; and the surface of the chip-mounting portion is higher than the upper surfaces of the parts of the leads that are exposed on the back surface of the resin.

BRIEF DESCRIPTION OF THE DRAWINGS

FIG. 14 (a) shows the cross-section along the F—F line of FIG. 13, and (b) shows the cross-section along the G—G line of FIG. 13.

DETAILED DESCRIPTION OF THE PREFERRED EMBODIMENT

Other than where required, the descriptions of identical or similar portions in the following embodiments are not repeated.

In the following embodiments, descriptions are divided into multiple sections or embodiments as required. However, the descriptions are related to each other except where an explicit statement is made to some other effect, and a description below is a modification, provides further details, or supplements part or all of some other description.

When numbers of elements and so on (including numbers, values, amounts, and ranges) are referred to in the following embodiments, the number need not be the stated number, unless an explicit statement is made to this effect or the number is clearly, in principle, limited to specific numbers. The number may be higher or lower than the stated number.

This invention is described in detail below on the basis of the embodiments shown in the accompanying drawings. Identical numerical references in the figures that describe the embodiments refer to the same items and their descriptions are not repeated.

Embodiment 1

Figure 1:
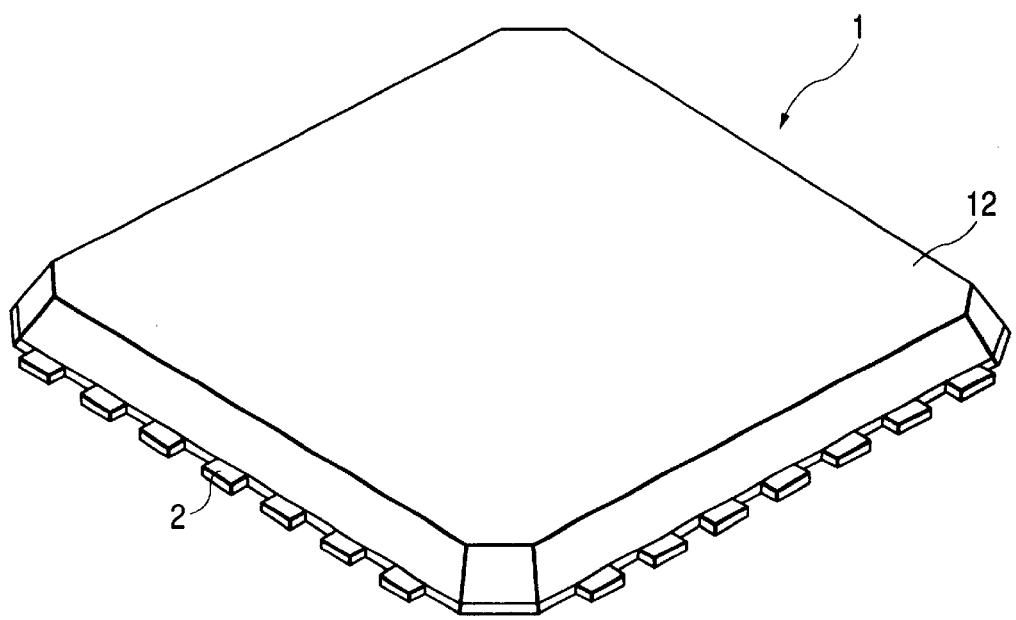
FIG. 1 is an isometric view of an example of the configuration of a semiconductor device (QFN: quad flat non-leaded package) that is embodiment 1 of this invention.
Figure 2:
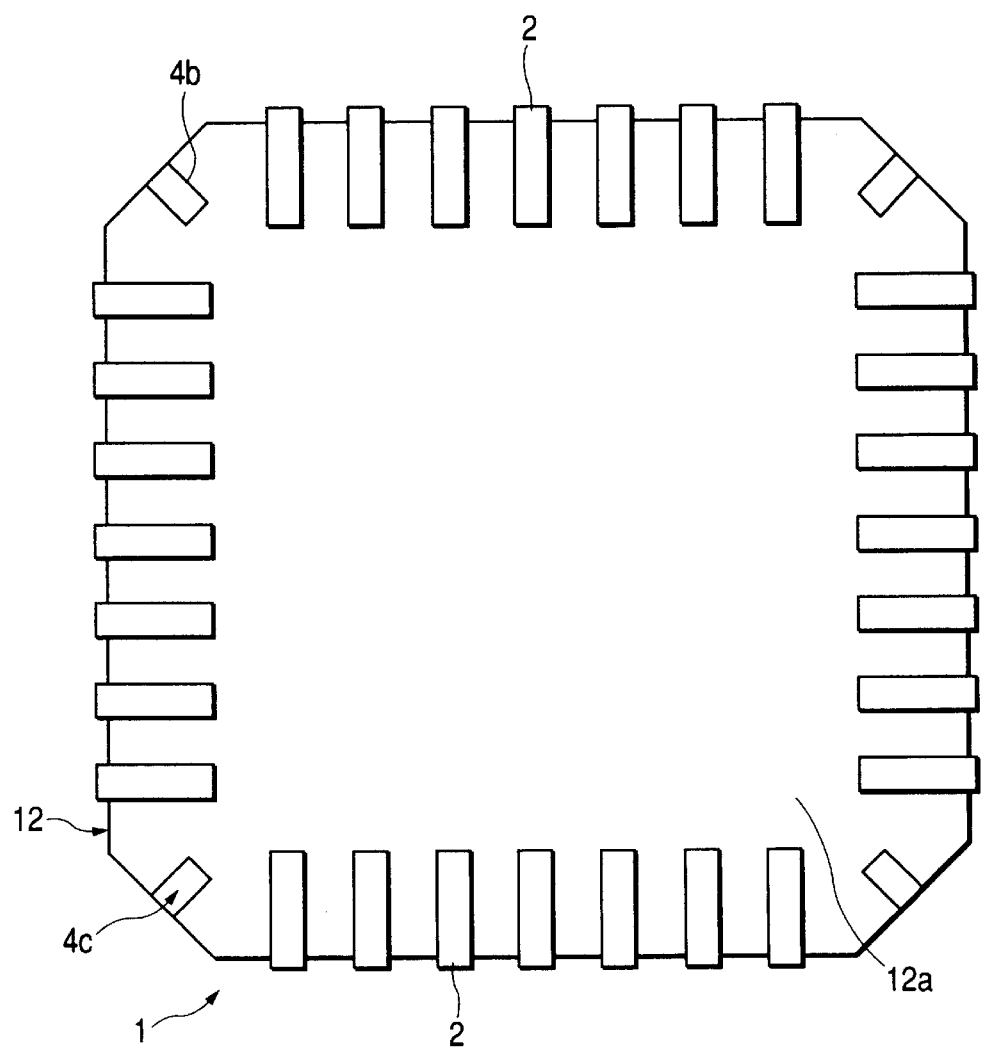
FIG. 2 is a bottom view of the configuration of the QFN of FIG. 1.
Figure 3:
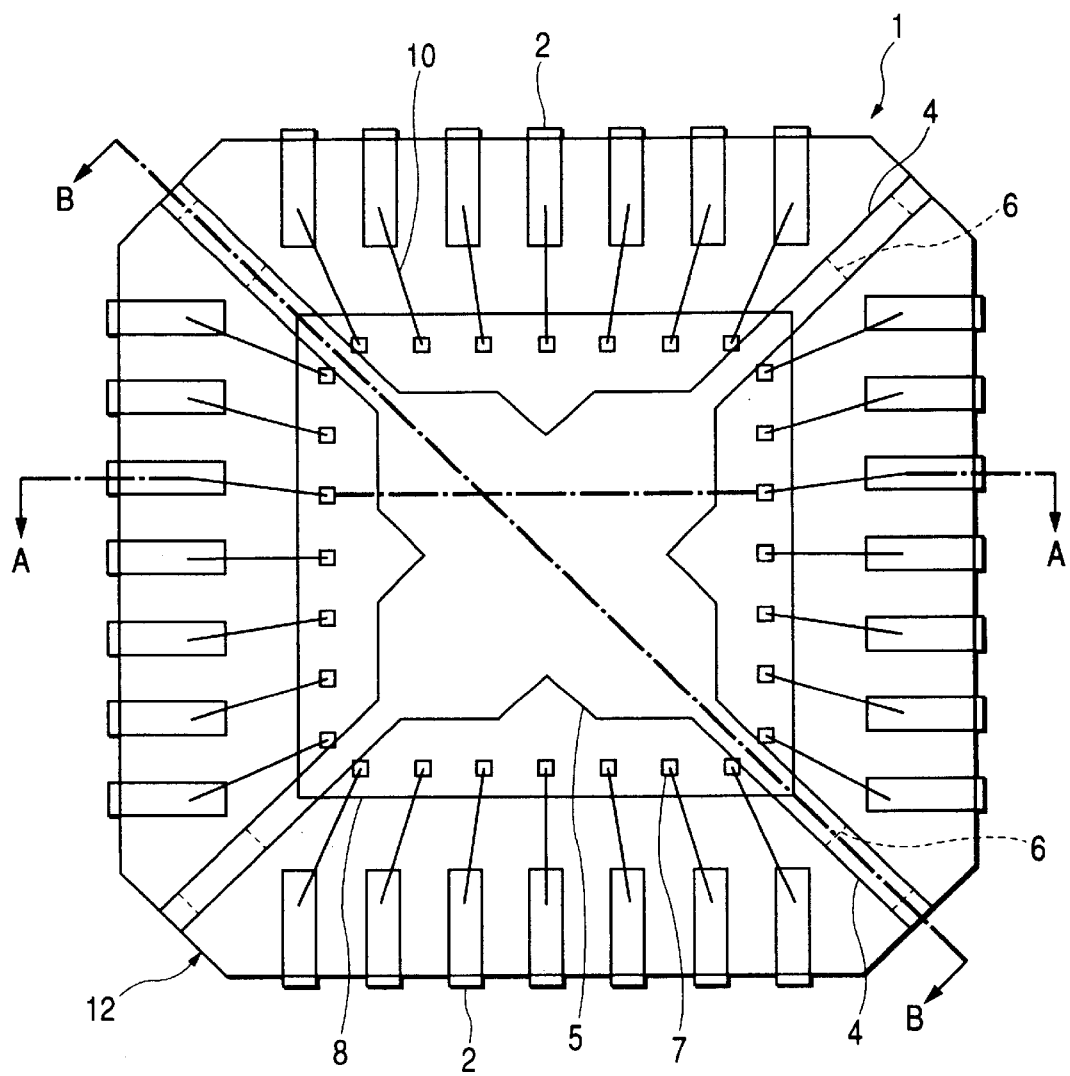
FIG. 3 is a transparent plan view of the molded section and semiconductor chip that shows the internal configuration of the QFN of FIG. 1.
Figure 4A:
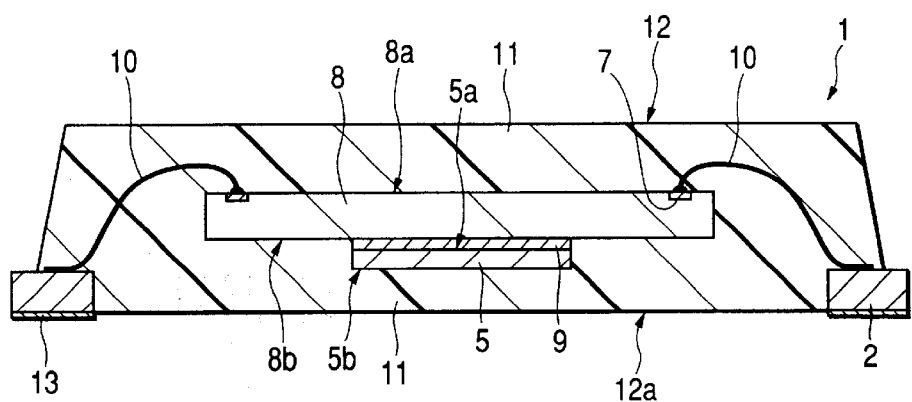
FIG. 4(a) shows the cross-section along the A—A line of FIG. 3, and (b) shows the cross-section along the B—B line of FIG. 3.
Figure 4B:
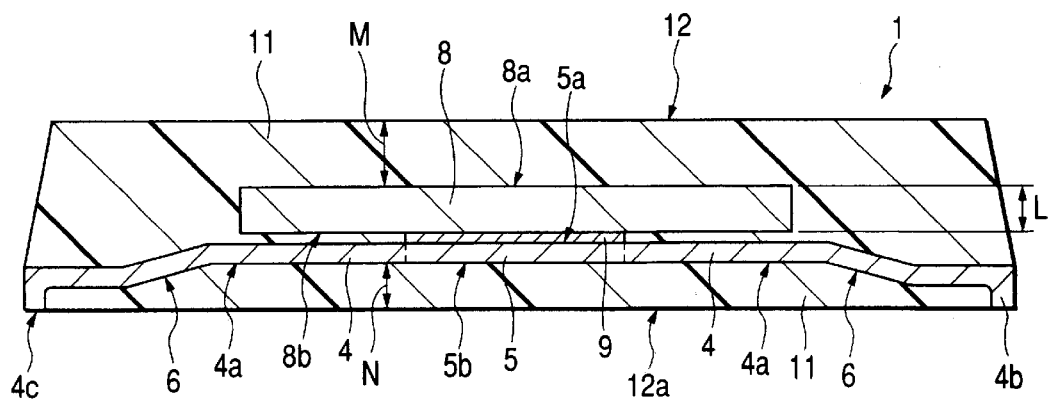
FIG. 4 are cross-sections through the QFN of FIG. 3.
Figure 5:
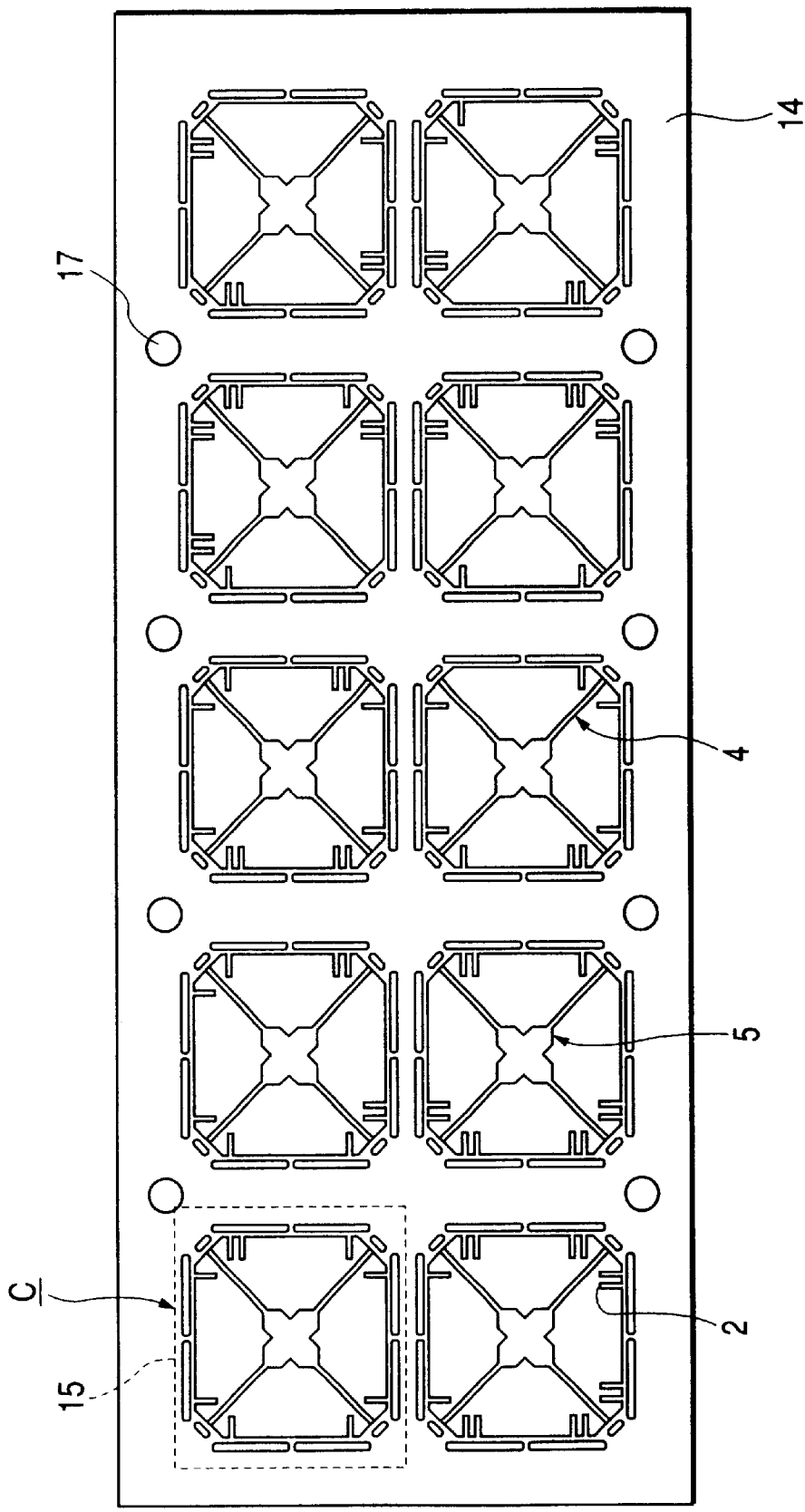
FIG. 5 is a plan view of the structure of the matrix leadframe, which gives an example of the leadframes used in fabricating the QFN of FIG. 1.
Figure 6:
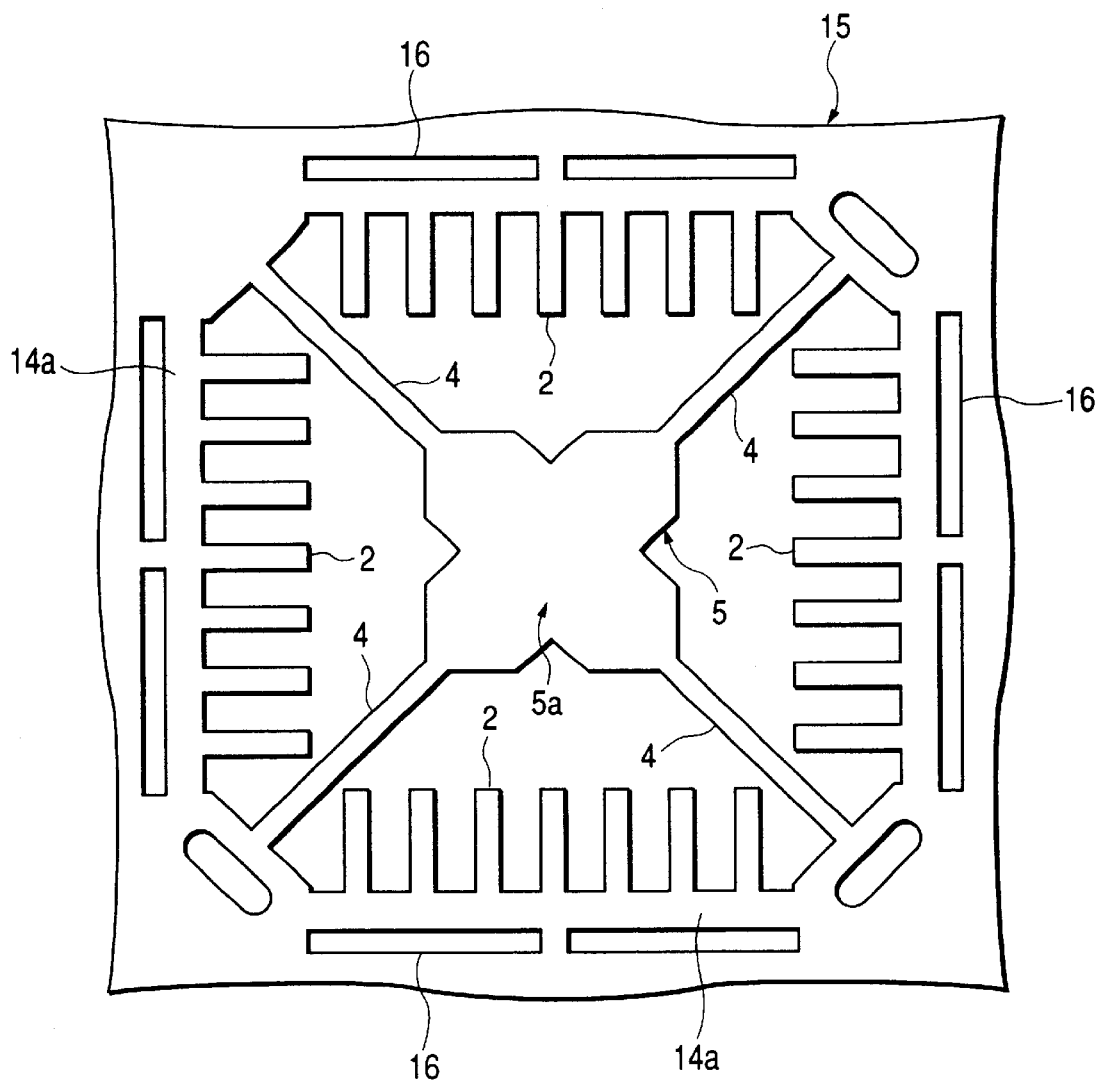
FIG. 6 is a partially magnified plan view of the configuration of region C of FIG. 5.
Figure 7A:
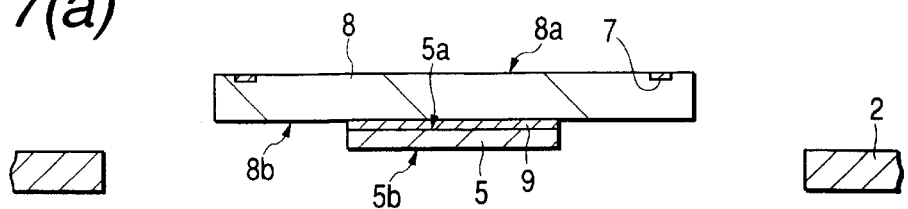
FIGS. 7(a) to (e) are cross-sectional drawings of examples of the configuration at each major step in fabricating the QFN of FIG. 1.
Figure 7B:
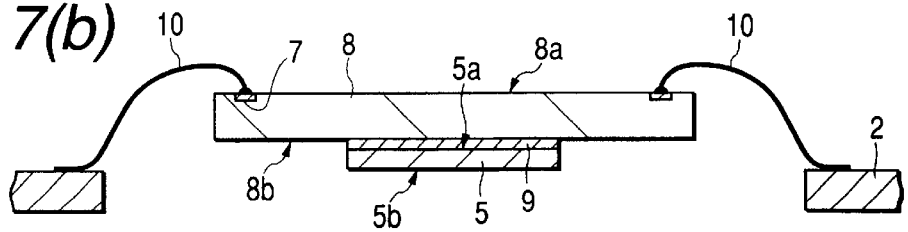
Figure 7C:
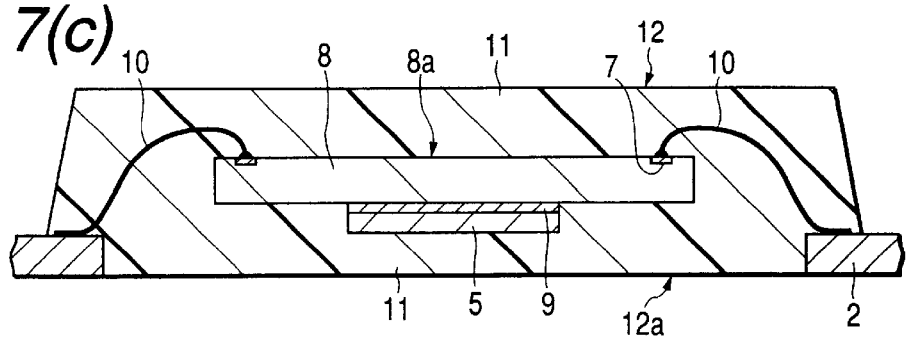
Figure 7D:
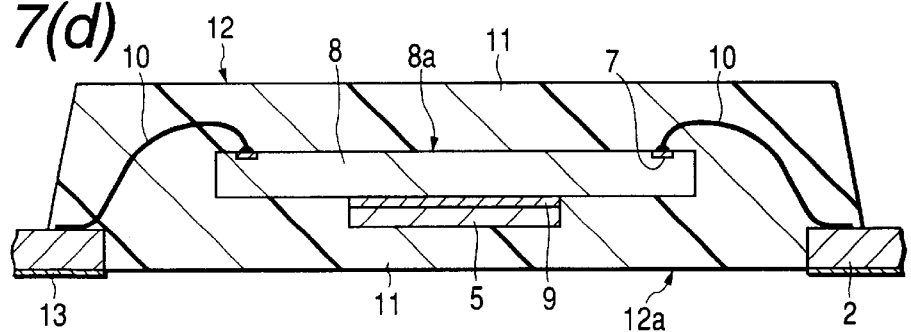
Figure 7E:
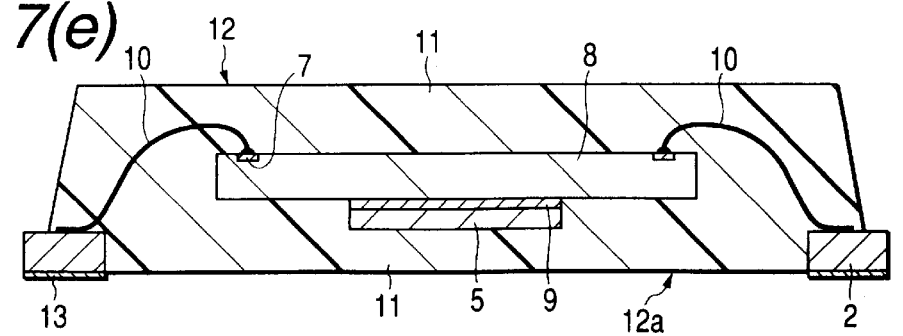
Figure 8:
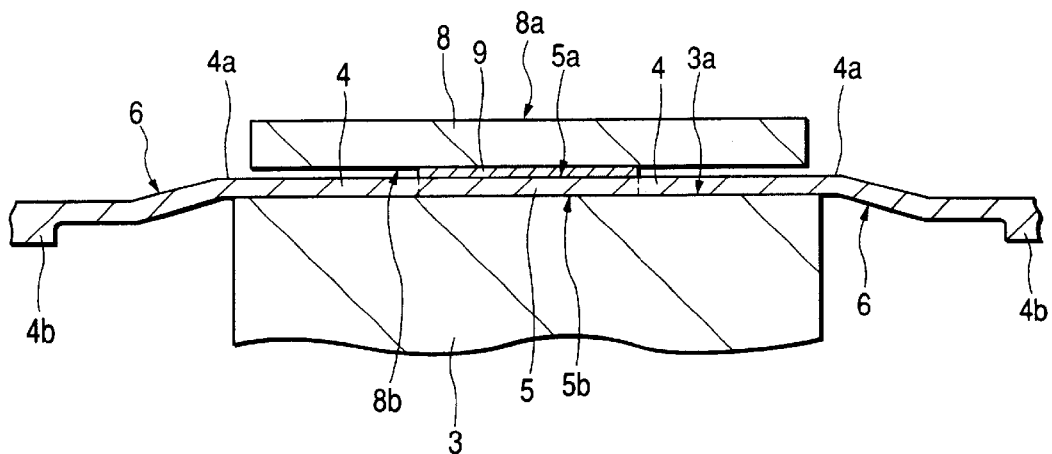
FIG. 8 is a partial cross-sectional view of an example of the die-bonding step in the process of fabricating the QFN which was shown in FIG. 7.

FIG. 1 is an isometric view of an example of the configuration of a semiconductor device (QFN: Quad flat non-leaded package) that is embodiment 1 of this invention, FIG. 2 is a bottom view of the configuration of the QFN in FIG. 1, and FIG. 3 is a transparent plan view of the molded section and of the semiconductor chip that shows the internal configuration of the QFN of FIG. 1. FIG. 4 shows cross-sections through the QFN of FIG. 3. FIG. 4 (a) is a cross-sectional view from along the A—A line of FIG. 3, and (b) is a cross-sectional view from along the B—B line of FIG. 3. FIG. 5 is a plan view of the configuration of a matrix leadframe. These frames are examples of the leadframes used in fabricating the QFN of FIG. 1. FIG. 6 is a magnified plan view of the configuration of section C in FIG. 5. In FIG. 7, (a) to (e) are cross-sectional drawings of examples of the configuration at each of the major steps in the process of fabricating the QFN of FIG. 1. FIG. 8 illustrates an example of the die-bonding step in the process of fabricating the QFN and is a partial cross-section of that step as shown in FIG. 7.

The semiconductor device that is embodiment 1 and is shown in FIGS. 1 and 2 is QFN 1 of the surface-mounting type. A section of each of leads 2, which are used as terminals for external connection, is exposed in the peripheral region of back surface 12a (surface on which the semiconductor device is mounted) of the molded section (resin) of said semiconductor device. A semiconductor device of this type is referred to as being of the peripheral type.

QFN1 includes a thin plate, made of copper or iron, that is formed in a desired shape. As shown in FIGS. 3, 5, and 6, this thin plate is made up of central tub (chip-mounting section) 5 supported by four suspension leads (supporting leads), and multiple leads 2 that are placed at the periphery of tub 5 and surround tub 5.

The configuration of QFN1 that is embodiment 1 is described in detail with reference to FIGS. 1 to 4. QFN1 is composed of tub 5 that supports semiconductor chip 8 and is smaller than semiconductor chip 8; molded section 12 that is formed by resin-molding around semiconductor chip 8; suspension leads 4, including the supporting portions 4a that support tub 5 and exposed portions 4b that are connected to the supporting portions and are exposed on back surface 12a of molded section 12, and is processed so that its supporting portions 4a are elevated (by a process of bending to elevate the tub); multiple leads 2 that are located around tub 5 and are exposed on back surface 12a of molded section 12; and thin metal wires (bonding wires) 10 that connect each of the electrode pads (bonding pads) of semiconductor chip 8 with a corresponding lead 2; wherein tub 5 and supporting portions 4a of suspension leads 4 are thinner than the exposed portions 4b and leads 2, and major surface 8a and part of back (opposite) surface 8b of semiconductor chip 8 are in firm contact with molded resin 11.

As shown in FIG. 4 (b), the thickness of tub 5 and supporting portions 4a of suspension leads 4 is about half of the thickness of exposed portions 4b, which are at the extremities of suspension leads 4, and of each lead 2. In addition, processing to elevate the tub is applied by bending supporting portions 4a of suspension leads 4. This places tub 5 higher than all leads 2, as is shown in FIG. 4 (a).

As a result, QFN1 has an embedded-tub configuration in which tub 5 is not exposed on back surface 12a of molded section 12. It is possible to reduce the thickness of this package without reducing the thickness (L) of semiconductor chip 8, as is indicated in FIG. 4 (b). In addition, the difference between the thickness of the resin (M) above the tub (the resin that covers semiconductor chip 8) and the resin (N) below the tub is reduced.

In QFN1, the difference between the quantities of molding resin 11 on major surface 8a of semiconductor chip 8 and on back side 8b of semiconductor chip 8 is reduced.

Half-etching is desirable as a way of reducing the thickness of tub 5 and supporting portions 4a of suspension leads 4 to about half that of exposed portions 4b of suspension leads 4 and of each lead 2. As well as half-etching, however, pressing processes, such as coining, are also applicable.

The process of bending supporting portions 4a so that tub 5 is set higher than each of leads 2 is referred to as elevation processing.

Supporting portions 4a of suspension leads 4 are bent away from exposed surfaces 4c of exposed portions 4b (i.e., in the direction of the surface that is opposite back surface 12a of molded section 12 of QFN1). Doing this elevates tub 5 to be higher than exposed portions 4b of suspension leads 4 and each of leads 2.

The elevated portion of supporting portions 4a of suspension leads 4 are referred to as stepped portions 6.

In QFN1 that is embodiment 1, elevation processing, that is, the process of bending to elevate the tub, is applied, outside the area of semiconductor chip 8, to the respective supporting portions 4a of the four suspension leads 4. This is shown in FIGS. 3 and 4 (b).

Specifically, stepped portions 6 of supporting portions 4a of suspension leads 4 are formed beyond the area of semiconductor chip 8, and not directly below semiconductor chip 8.

In addition, in QFN1, tub 5 has chip-supporting surface 5a that is smaller than semiconductor chip 8. Tub 5 of embodiment 1 is of the cross type, where chip-supporting surface 5a forms a cross, and is also referred to as a small tub.

As shown in FIGS. 3 and 4 (a), since the area of chip-supporting surface 5a of tub 5 is much smaller than that of back surface 8b of semiconductor chip 8, the periphery of back surface 8b of semiconductor chip 8 extends horizontally beyond the area of tub 5, and part of the periphery of back surface 8b of semiconductor chip 8 adheres to molding resin 11.

A predetermined semiconductor integrated circuit, such as a microcomputer, an ASIC (application-specific integrated circuit), a gate array, a system LSI (large-scale integrated circuit), or memory, and multiple pads 7 that are made of aluminum for use as the external terminals of this semiconductor integrated circuit are formed on major surface 8a of semiconductor chip 8.

Adhesive agent 9, which is a die-bonding material such as conductive paste or a non-conductive film, is used to affix semiconductor chip 8 to chip-supporting surface 5a of tub 5, with the semiconductor integrated circuit upside.

Each pad 7 of semiconductor chip 8 is connected to one major surface of corresponding lead 2 via wire 10, which is a thin wire made of a conductive metal, for example, Au or Al.

To protect internal components and improve the robustness against moisture, semiconductor chip 8, wires 10, tub 5, the upper and side surfaces of leads 2, and suspension leads 4 other than the exposed surfaces 4c of exposed portions 4b are embedded in molded section 12 that is formed of molding resin 11 which is, for example, a thermosetting epoxy resin. However, the back surfaces (the other major surface) of respective leads 2 are exposed in the peripheral region of back surface 12a of molded section 12 as the terminals for external connection of QFN1.

To improve the robustness of QFN1 against moisture and its characteristics in terms of mounting on the assembly board, external processing such as solder plating using Pb-Sn type solder, is applied to the back surfaces of leads 2 that are exposed on back surface 12a of molded section 12.

Hereinafter, the thin film that has been formed by said external processing is called plated portion 13, which is shown in FIG. 4 (a). The external processing may be a plating process in which a Pb-free solder, such as Sn-Ag or Sn-Zn solder is used. Plated portion 13 is approximately 10-μm thick.

The method of fabricating QFN1 of embodiment 1 is described with reference to FIGS. 1 to 8 on the basis of the flowchart of cross-sections given as FIG. 7.

Matrix leadframe 14 shown in FIG. 5 is prepared in which tub 5 and supporting portions 4a are made thinner than leads 2 and exposed portions 4b. Each leadframe comprises small tub 5 that is able to support semiconductor chip 8 and is smaller than semiconductor chip 8, supporting portions 4a that support tub 5, exposed portions 4b that are connected to supporting portions 4a, suspension leads 4 that are elevated at supporting portions 4a, and multiple leads 2 that are arranged around tub 5.

Specifically, in suspension leads 4 of individual leadframe 15 as shown in FIGS. 5 and 6, supporting portions 4a are bent away from exposed surfaces 4c of exposed portions 4b.

Processing to elevate the tub is applied to each of leadframes 15.

Tub 5 and supporting portions 4a of suspension leads 4 that support the tub are made thinner than exposed portions 4b of suspension leads 4 by half-etching. This process may be replaced by a process of pressing, such as coining.

Chip-supporting surface 5a of tub 5 must be smaller than semiconductor chip 8.

Matrix leadframe 14 is formed by using etching to form a metal plate made of, for example, Cu or Fe, into a pattern.

As shown in FIG. 5, the individual leadframes that each correspond to the area of a single QFN1 are arranged in a matrix fashion to make up, for example, a total of ten (five in the direction of length and two in the direction of breadth).

As shown in FIG. 6, stress relieving slits 16 are formed to relax the stresses that are applied to matrix leadframe 14 during the fabrication process. Guide holes 17 are formed in the sides that run along the length of matrix leadframe 14. They are used to hold or position the leadframes.

Tubs 5, each of which is supported by four suspension leads 4, are formed in the centers of each leadframe 15, and multiple leads 2 surround tub 5 and are supported by frame section 14a.

As shown in FIG. 7 (a), die bonding is applied to bond tub 5 to part of the central section of back surface 8b of semiconductor chip 8.

In this case, adhesive agent 9, which is, for example, a conductive paste, non-conductive paste, or non-conductive film, is used to affix semiconductor chips 8 to each tub 5 of matrix leadframe 14.

Firstly, stepped portions 6 (the elevating portions) of supporting portions 4a of suspension leads 4 are placed outside the area of bonding stage 3 shown in FIG. 8. Specifically, processing to elevate the tub (elevation processing) is applied to the respective supporting portions 4a of the four suspension leads 4 outside the area of semiconductor chip 8.

Stepped portions 6 of supporting portions 4a of suspension leads 4 are formed outside the area of semiconductor chip 8, and not directly below semiconductor chip 8. This makes it possible, as is shown in FIG. 8, to use bonding stage 3 that has stage surface 3a which is larger than semiconductor 8. It is thus possible for stage surface 3a of bonding stage 3 to firmly support semiconductor chip 8, tub 5, and suspension leads 4.

Bonding stage 3 supports tub 5 and some portion of suspension leads 4 while tub 5 is affixed (die-bonded) to semiconductor chip 8 by adhesive agent 9. That is, bonding stage 3 supports tub 5 and those parts of supporting portions 4a of suspension leads 4 that are within stepped portions 6.

As shown in FIG. 7 (b), each pad 7 of semiconductor chip 8 is then connected with the corresponding lead 2 by a conductive wire (thin metal wire) made of, for example, Au. Wires 10 are used in wire bonding.

As shown in FIG. 7 (c), transfer molding is used to embed semiconductor chip 8, wires 10, tub 5, the upper and side surfaces of lead 2, and suspension leads 4 (see FIG. 4 (b)) other than exposed surfaces 4c of exposed portions 4b in molding resin 11 which is, for example, an epoxy resin or silicon resin.

Since tub 5 is smaller than semiconductor chip 8, the sides of semiconductor chip 8 extend beyond the area of tub 5. Therefore, it is possible to make molding resin 11 that comes into contact with the side edges of semiconductor chip 8 fill the space around tub 5 from chip-supporting surface 5a to the opposite surface, that is, to back surface 5b.

By doing this, part of the periphery of back surface 8b of semiconductor chip 8 can be made to tightly adhere to molding resin 11 as shown in FIG. 4 (a). In addition, molded section 12 can be formed with multiple leads 2 and exposed surfaces 4c of exposed portions 4b of suspension leads 4 positioned on back surface 12a of molded section 12.

As shown in FIG. 7 (d), to improve the robustness against moisture and the QFN1 characteristics in terms of mounting on the assembly board, external processing is applied to leads 2 that are exposed on back surface 12a of molded section 12. Solder plating by Pb-Sn solder is preferable as this external processing; however, plating by Pb-free solder, for example, An-Ag or Sn-Zn, may be applied. Setting the thickness of plated portion 13 obtained by said external processing to approximately 10 μm also makes it possible to ensure, for QFN1, that plated portion 13 sticks out by the thickness obtained by said external processing.

As shown in FIG. 7 (e), leads 2 and suspension leads 4 of individual leadframes 15 of matrix leadframe 14 are cut at positions that are slightly outside the areas of each of molded sections 12.

The result, as is shown in FIG. 4 (b), is that suspension leads 4 are separated at exposed portions 4b of suspension leads 4, and multiple leads 2 are separated from frame section 14a of matrix leadframe 14, and QFN1 as shown in FIG. 1 is thus obtained.

In said method of fabrication, the external processing is accomplished by solder plating. However, this invention is not limited in this way. Matrix leadframe 14 may be prepared in advance by applying a form of external processing such as Pd plating to the portions of the leads that will protrude from the semiconductor device. In this case, since external processing is not required in the process of fabricating QFN1, the number of steps is reduced and productivity can thus be improved.

The following advantages can be obtained by applying QFN1 that is embodiment 1 and the method of its fabrication.

Tub 5 and supporting portions 4a of suspension leads 4 are made thinner than exposed portions 4b, and the elevation processing (processing to elevate the tub) is applied to supporting portions 4a of suspension leads 4. Therefore, it is possible to obtain a large thickness (thickness (N) shown in FIG. 4 (b)) to back surface 5b of tub 5 of molded section 12.

As a result, it is possible to reduce the difference between the thickness of the resin on the upper portion (major surface 8a) and on the lower portion (back surface 8b) of semiconductor chip 8.

To restate this, it is possible to reduce the difference between the thickness (M) of the resin above the tub and the thickness (N) of the resin below the tub.

As a result, a good balance between molding resin 11 above and below semiconductor chip 8 can be obtained, and the amount of stress that is applied to molded section 12 below semiconductor chip 8 during temperature cycling tests can thus be reduced.

In addition, since back surface 8b of semiconductor chip 8 firmly adheres to molding resin 11, the adhesive strength between molding resin 11 on back surface 8b of semiconductor chip 8 and semiconductor chip 8 can be improved.

The improved balance between the resin above and below semiconductor chip 8 and the improved adhesion between molding resin 11 and back surface 8b of semiconductor chip 8 accordingly suppresses the generation of cracks in the package. The temperature cycling characteristics of the device have thus been improved.

Designing tub 5 like tub 5 in embodiment 1, that is, in such a way that part of back surface 8b of semiconductor chip 8, for example, the periphery, adheres to molding resin 11, makes it possible to increase the quantity of molding resin 11 below back surface 8b of semiconductor chip 8.

This configuration can further improve the balance between the resin above and below semiconductor chip 8 and the temperature cycling characteristics of the device.

Since tub 5 is smaller than semiconductor chip 8, molded section 12 is not split into upper and lower portions by tub 5; the resin is able to tightly adhere to semiconductor chip 8, from its sides to its back surface 8b.

As a result, the temperature cycling characteristics of the device can be improved.

Tub 5 and supporting portions 4a of suspension leads 4 are made thin, and elevation processing (processing to elevate the tub) is applied to supporting portions 4a of suspension leads 4. It is thus possible to improve the balance between the resin above and below semiconductor chip 8 without changing its height.

Accordingly, the thickness of QFN1 can be reduced while maintaining the resin balance in semiconductor chip 8.

In QFN1 that is embodiment 1, stepped portions 6 of supporting portions 4a of suspension leads 4 are formed outside the area for semiconductor chip 8, and are not directly below semiconductor chip 8. This makes it possible to use bonding stage 3 that has stage surface 3a which is larger than semiconductor chip 8, as shown in FIG. 8.

In this configuration, stage surface 3a of bonding stage 3 is able to firmly support semiconductor chip 8, tub 5, and suspension leads 4 during die bonding. As a result, the characteristics of QFN1 in terms of mounting can be improved.

In QFN1 that is embodiment 1, in molded section 12, forming stepped portions 6 of suspension leads 4 outside the area of semiconductor chip 8 makes it possible to increase the volume of molding resin 11 below supporting portions 4a of suspension leads 4 and below tub 5.

Accordingly, since molding resin 11 that is to be applied below suspension leads 4 and tub 5 is readily applied concurrently with the application of molding resin 11 to the upper portion, the ability of the resin to flow during resin molding can be improved.

As a result, the quality and reliability of QFN1 can be improved.

Since the resin has a high ability to flow both above and below semiconductor chip 8 and suspension leads 4, the difference between the abilities to flow in the two regions is reduced. Tub 5 is thus not dislocated from its vertical position.

Accordingly, fixing the tub in a stable position within QFN1 is possible and this provides improved quality.

Embodiment 2

Figure 9:
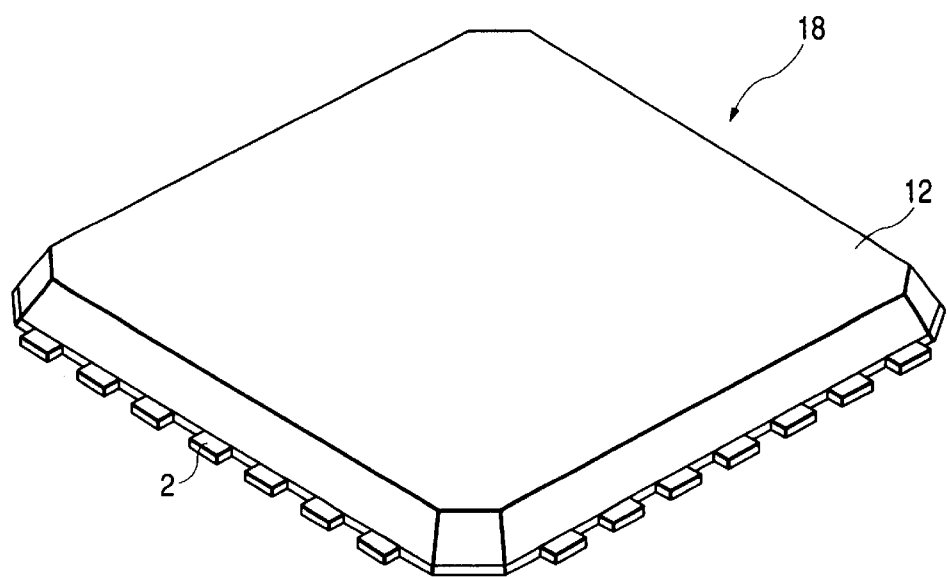
FIG. 9 is an isometric view of an example of the configuration of a semiconductor device (QFN) that is embodiment 2 of this invention.
Figure 10:
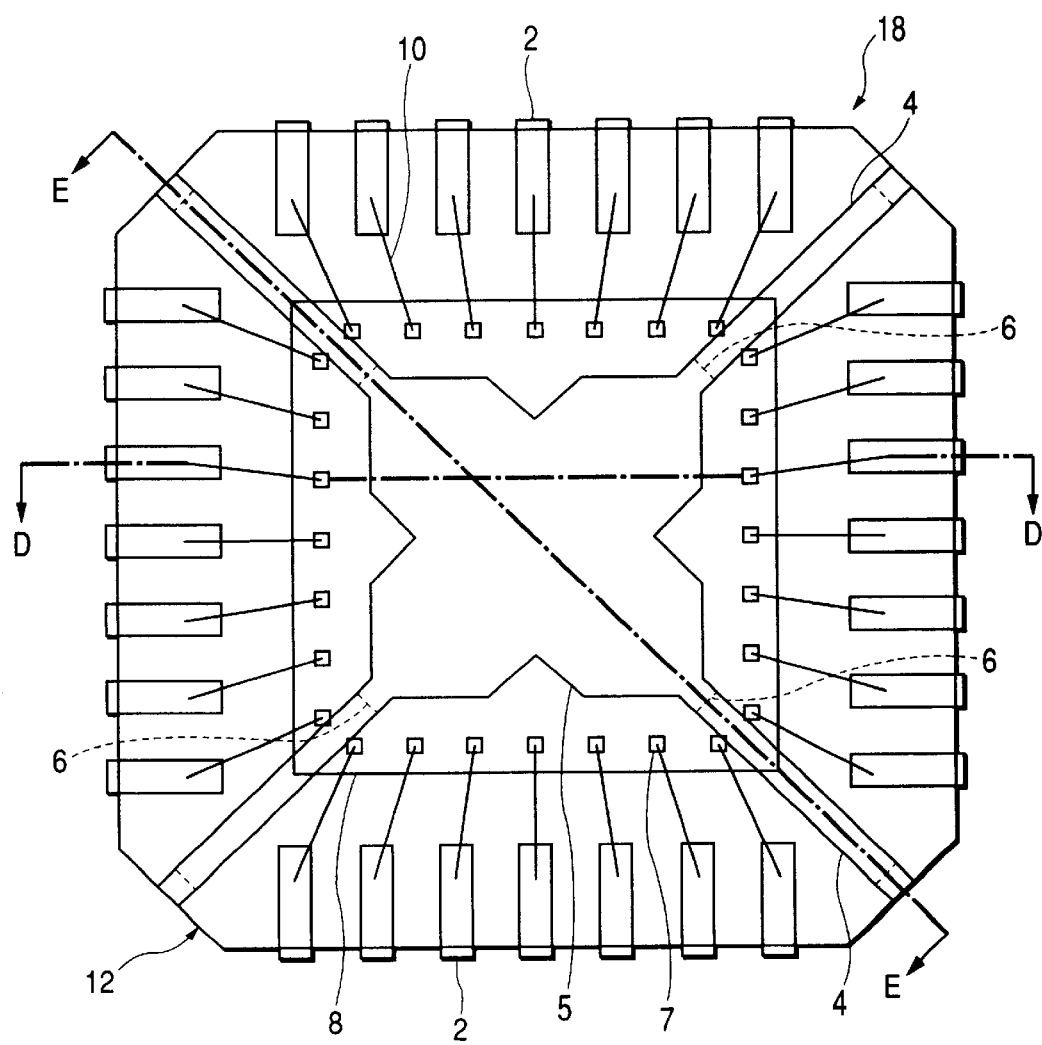
FIG. 10 is a transparent plan view of the molded section and semiconductor chip that shows the internal configuration of the QFN of FIG. 9.
Figure 11A:
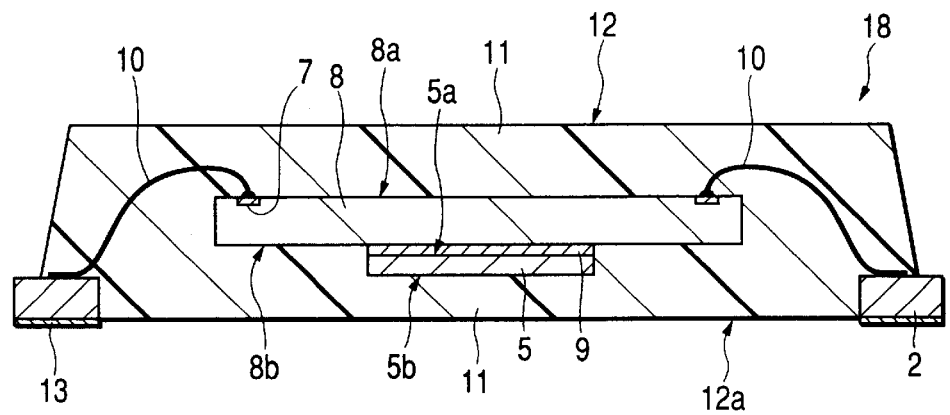
FIG. 11(a) shows the cross-section along the D—D line of FIG. 10, and (b) shows the cross-section along the E—E line of FIG. 10.
Figure 11B:
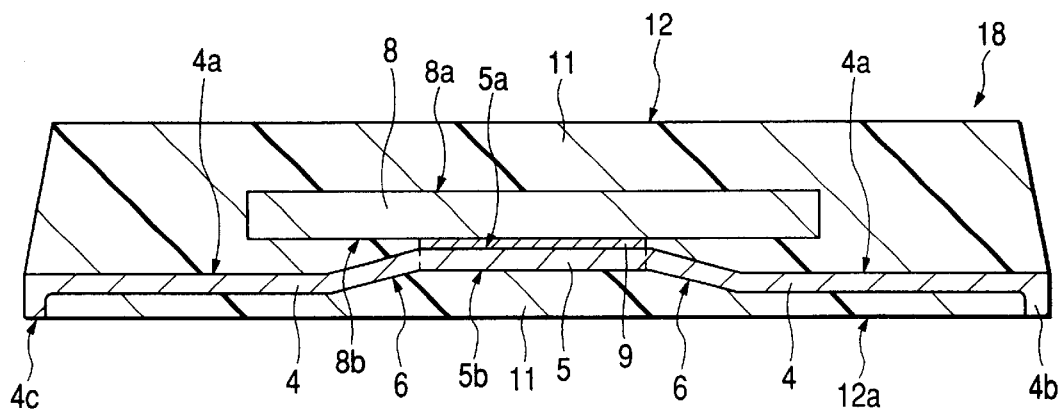
FIGS. 11 are cross-sections through the QFN of FIG. 10.

FIG. 9 is an isometric view of an example of the structure of a semiconductor device (QFN) that is embodiment 2 of this invention. FIG. 10 is a transparent plan view of the molded section and semiconductor chip that shows the internal configuration of the QFN of FIG. 9. FIG. 11 shows cross-sections through the QFN of FIG. 10. FIG. 11 (a) shows the cross-section along the D—D line of FIG. 10, and (b) shows the cross-section along the E—E line of FIG. 10.

QFN18 that is embodiment 2 is shown in FIG. 9. It is almost the same as QFN1 that was described as embodiment 1. Therefore, only the distinctive features are described here, and descriptions that overlap with those of embodiment 1 are omitted.

In QFN18 as shown in FIG. 11 (b), suspension leads 4 have been elevation processed (bent to elevate the tub) at supporting portions 4a below semiconductor chip 8.

That is, elevation processing is applied near tub 5 to supporting portions 4a of suspension leads 4. Therefore, the elevation processing of supporting portions 4a places stepped portions 6 below back surface 8b of semiconductor chip 8.

The rest of the other structure of QFN18 is the same as that of QFN1 which was described as embodiment 1.

When the resin is molded in the assembly of QFN18 that is embodiment 2, molding resin 11 is provided in the region outside the central region of back surface 8b and between semiconductor chip 8 and supporting portions 4a of suspension leads 4, as is shown in FIG. 11 (b). Therefore, it is possible for molding resin 11 to be firmly in contact with back surface 8b of semiconductor chip 8 that is above supporting portions 4a and stepped portions 6.

When stepped portions 6 of supporting portions 4a are formed below the peripheral region of back surface 8b of semiconductor chip 8, molding resin 11 is firmly in contact with back surface 8b of semiconductor chip 8 that is above stepped portions 6 of supporting portions 4a.

QFN18 that is embodiment 2 makes it possible to obtain firm contact between molding resin 11 and back surface 8b of semiconductor chip 8 that is above stepped portions 6 of supporting portions 4a of suspension leads 4. Therefore, the area of contact between molding resin 11 and back surface 8b of semiconductor chip 8 can be increased.

Accordingly, the characteristics of QFN18 in terms of robustness against reflow cracking can be improved.

The other advantages that can be obtained by applying QFN18 that is embodiment 2 and by the method of its fabrication are almost the same as those of QFN1 that is embodiment 1. These descriptions that overlap with those of embodiment 1 are thus omitted.

Embodiment 3

Figure 12:
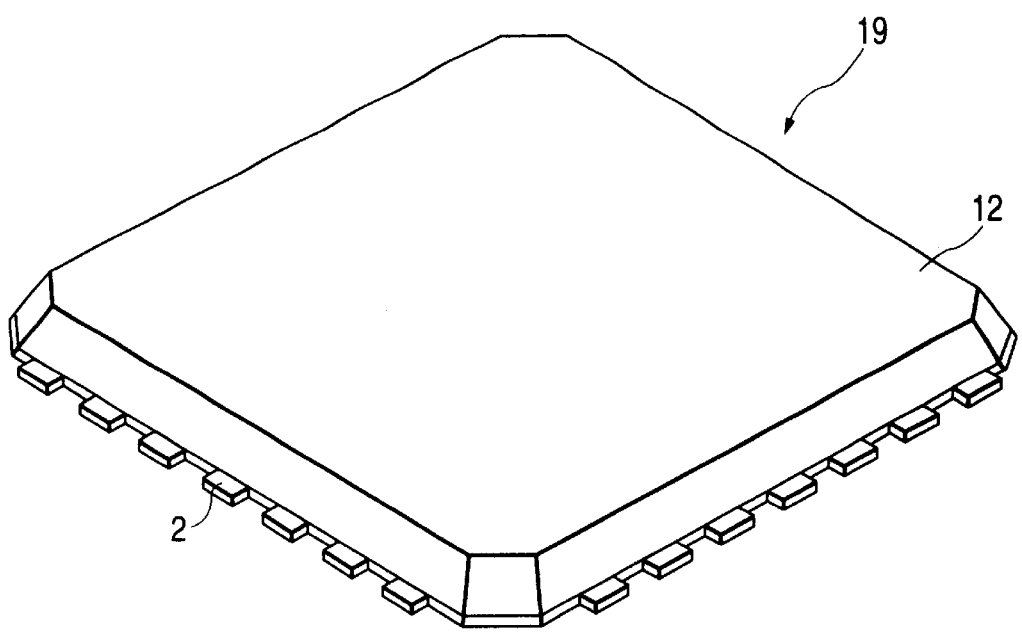
FIG. 12 is an isometric view of an example of the configuration of a semiconductor device (QFN) that is embodiment 3 of this invention.
Figure 13:
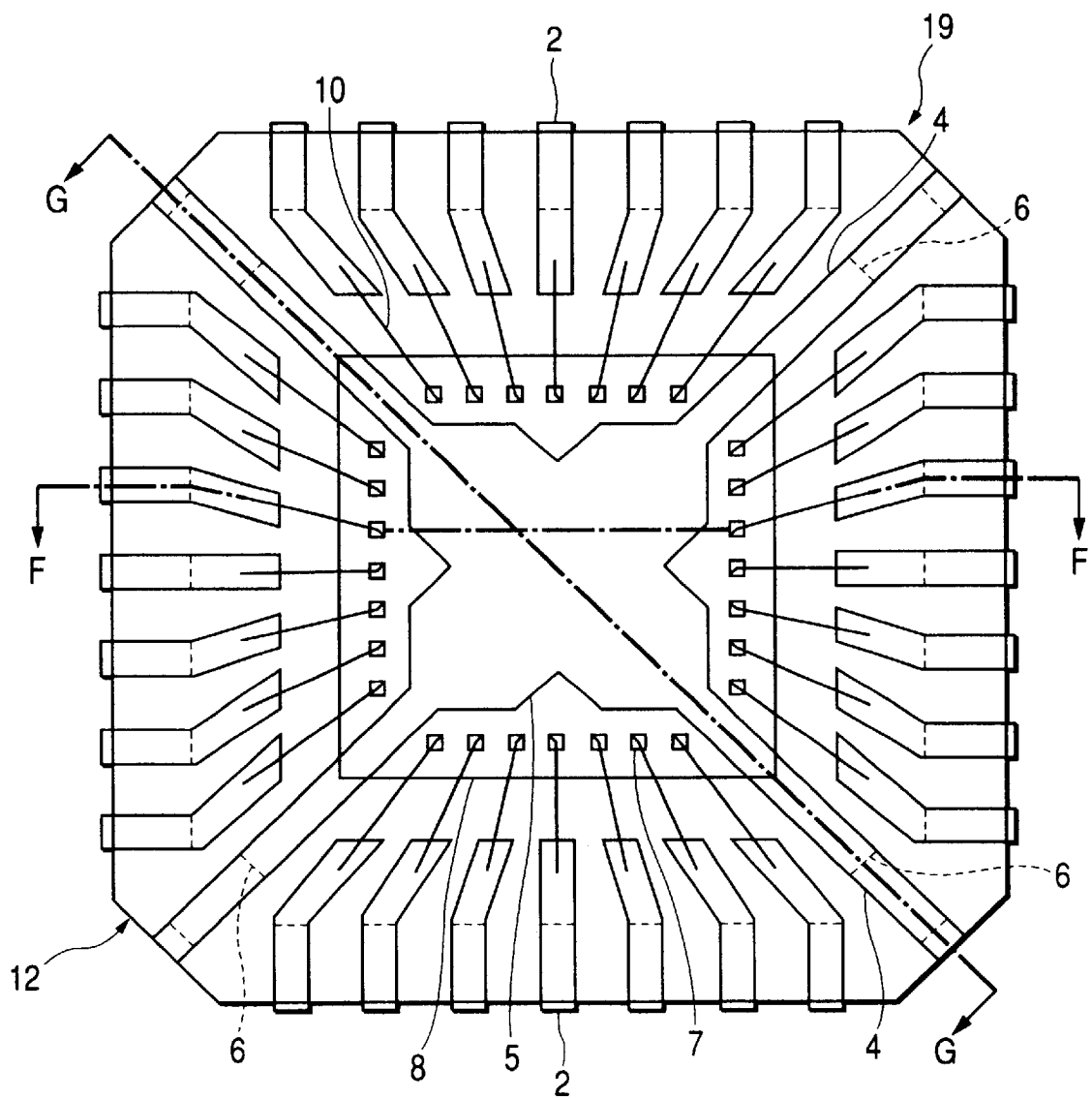
FIG. 13 is a transparent plan view of the molded section and semiconductor chip that shows the internal configuration of QFN of FIG. 12.
Figure 14A:
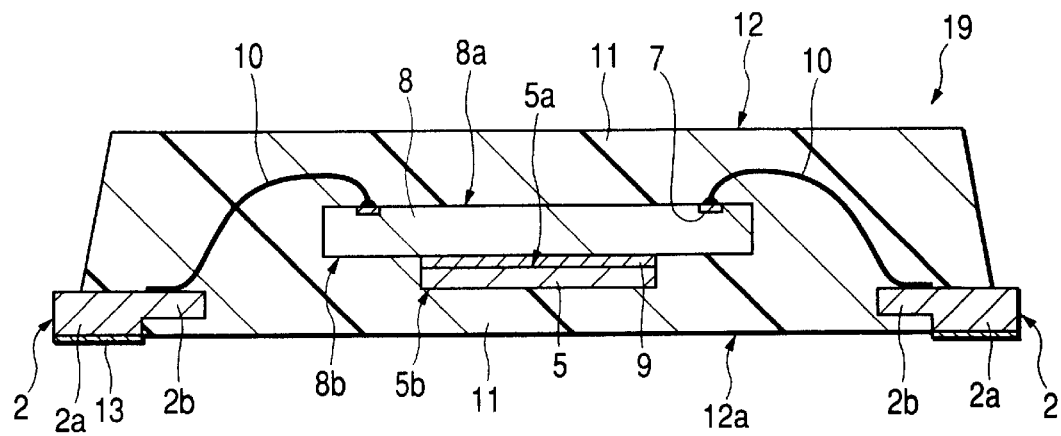
FIG. 14 are cross-sections through the QFN of FIG. 13.
Figure 14B:
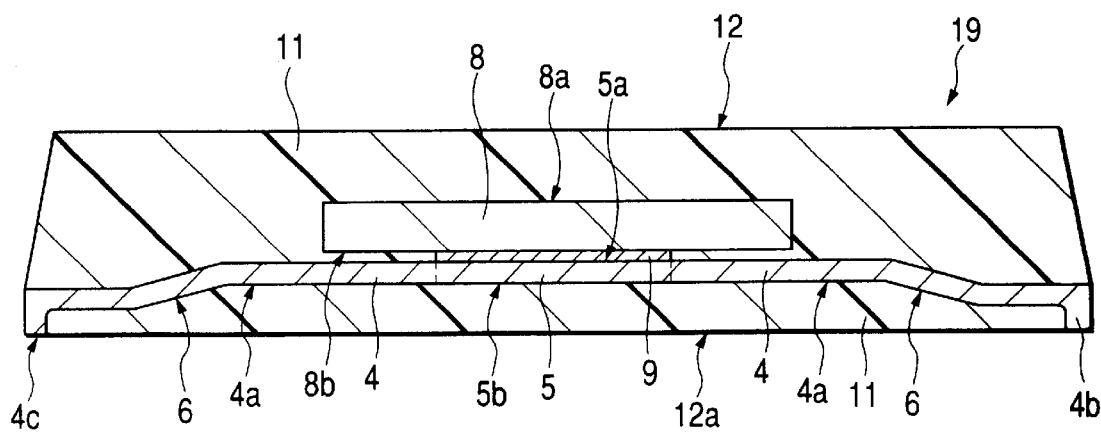

FIG. 12 is an isometric view of an example of the configuration of the semiconductor device (QFN) that is embodiment 3 of this invention. FIG. 13 is a transparent plan view of the molded section and semiconductor chip that shows the internal configuration of the QFN of FIG. 12. FIG. 14 shows cross-sections through the QFN of FIG. 13. FIG. 14 (a) shows the cross-section along the F—F line of FIG. 13, and (b) shows the cross-section along the G—G line of FIG. 13.

QFN19 that is embodiment 3 shown in FIG. 12 is almost the same as QFN1 that was described as embodiment 1. Therefore, only the distinctive features are described here, and descriptions that overlap with those of embodiment 1 are omitted.

In QFN19 as shown in FIG. 14 (a), leads 2 are exposed on back surface 12a of molded section 12 and are comprised of thick portions 2a and thin portions 2b which extend within the device; the two form a step in the direction of vertical thickness.

That is, each of leads 2 located in the peripheral region of back surface 12a of molded section 12 includes thick portion 2a and thin portion 2b. A surface (the bottom surface) of thick portions 2a is exposed in the peripheral region of back surface 12a of molded section 12, and thin portions 2b are covered by molding resin 11.

That is, in each of leads 2, thin portion 2b is formed thinner than thick portion 2a which is exposed on back surface 12a of molded section 12. Thin portions 2b to which wires 10 are connected are embedded in molded section 12 as inner leads, and the surfaces of thick portions 2a that are exposed on back surface 12a of molded section 12 act as the outer leads.

Thin portions 2b of leads 2 extend within the package in the direction of semiconductor chip 8.

The steps are made in leads 2 of QFN19 to form thick portions 2a and thin portions 2b by a process such as the half-etching process or by a process of pressing, such as coining (processing to form thin portions 2b).

In QFN19 that is embodiment 3 and the method of its manufacture, a step, that is, thick portion 2a and thin portion 2b are formed in each lead 2. Thin portion 2b is embedded in molded section 12. This stops leads 2 from being detached from or falling out of molded section 12.

In addition, since thin portions 2b that extend inside the package are formed in leads 2, it is possible to implement QFN19 without lengthening wire 10 when QFN19 is enlarged and/or semiconductor chip 8 is miniaturized.

The other advantages that are provided by QFN19 and the method of its manufacture are almost the same as those of QFN1 that is embodiment 1. These descriptions that overlap with those of embodiment 1 are thus omitted.

This invention was described in detail above on the basis of embodiments. However, this invention is not restricted to these embodiments; various modifications are possible without deviating from the essential points of the invention.

Figure 15:
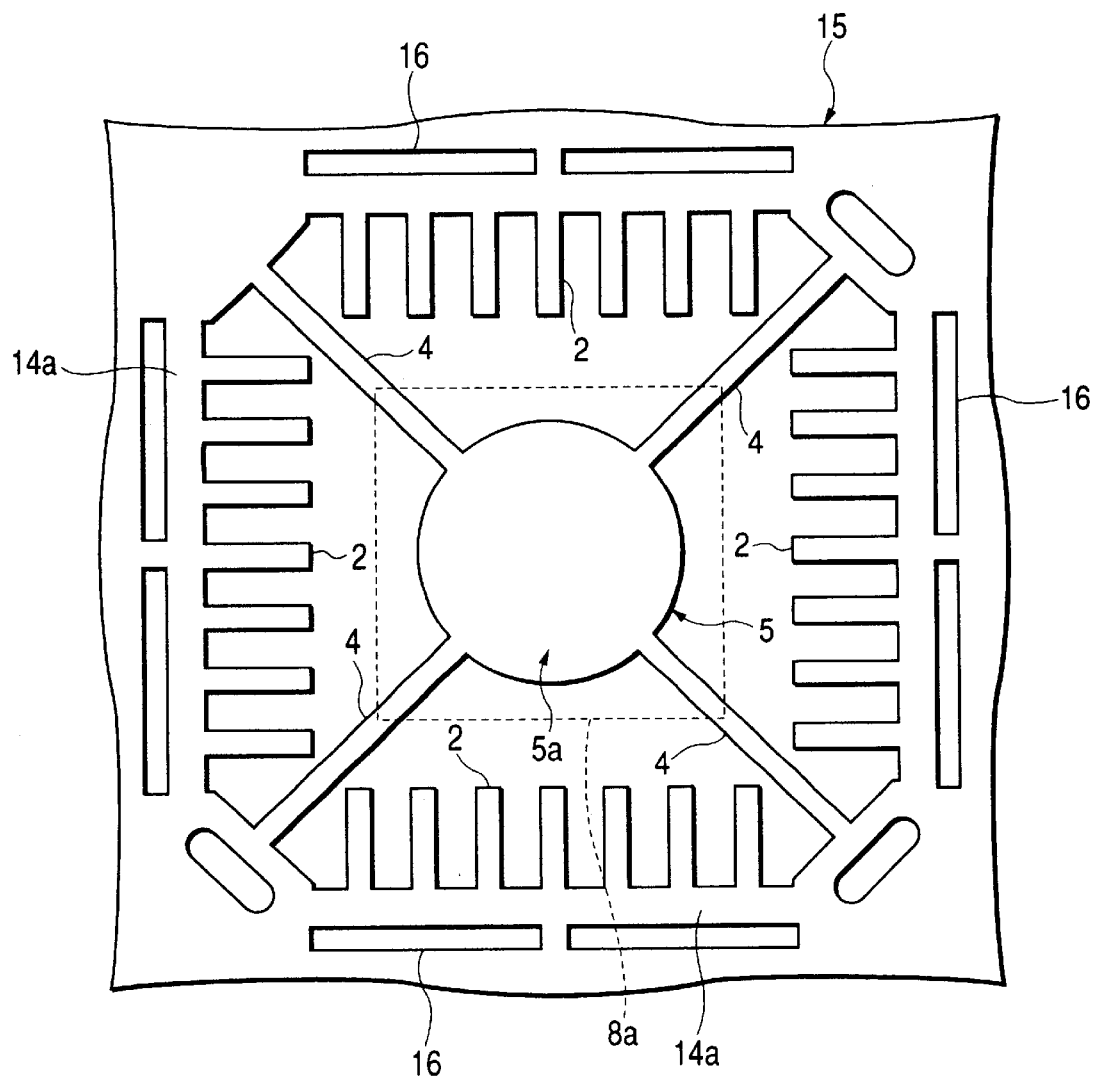
FIG. 15 is a partially magnified plan view of the configuration of a matrix frame that is an example of the modification of the matrix frame shown in FIG. 5.

For instance, although cross-shaped tub 5 is used in embodiments 1 to 3, the shape of tub 5 is not restricted in this way; a disc shape may also be used, as in the example of this modification that is shown in FIG. 15.

Disc-shaped tub 5 that is shown in FIG. 15 can improve the temperature-cycling characteristics of a semiconductor device.

Figure 16:
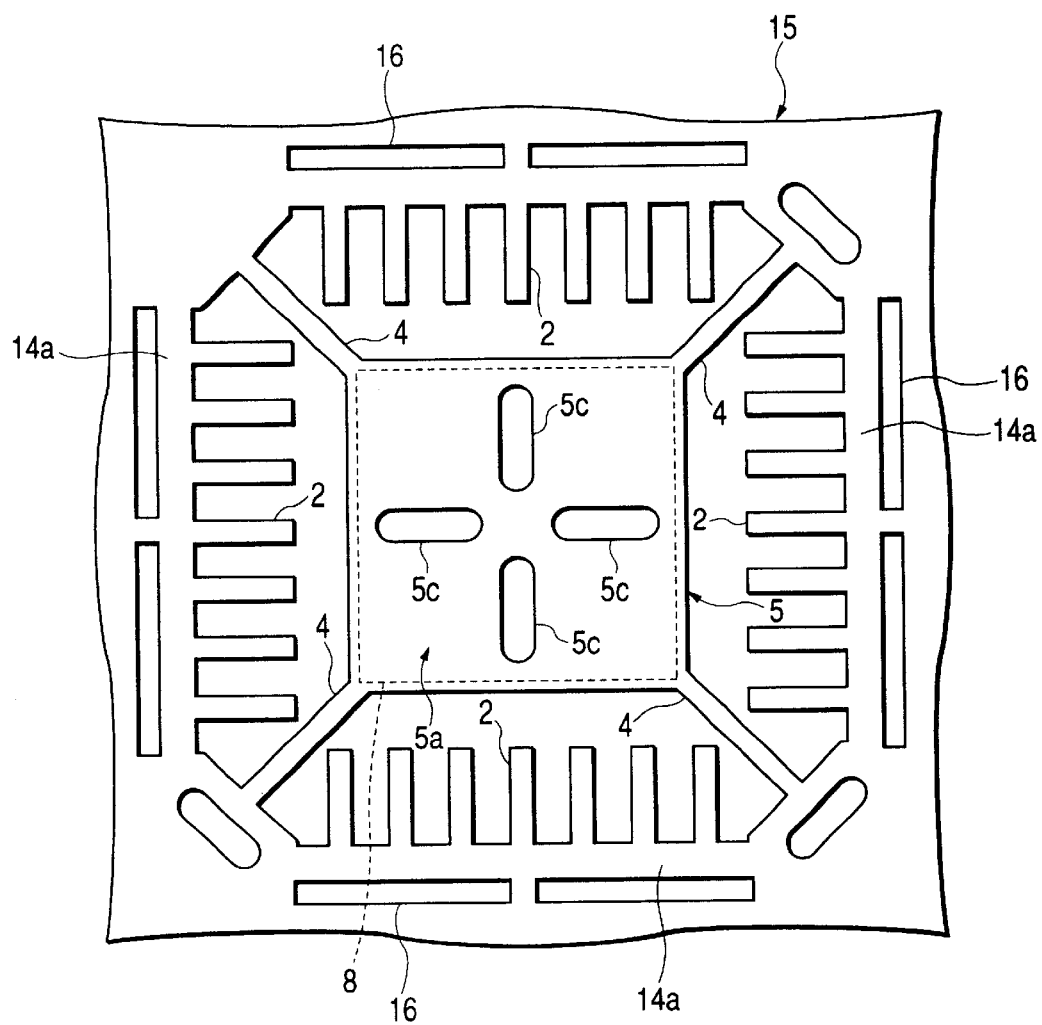
FIG. 16 is a partially magnified plan view of the configuration of a matrix frame that is an example of the modification of the matrix frame shown in FIG. 5.
Figure 17:
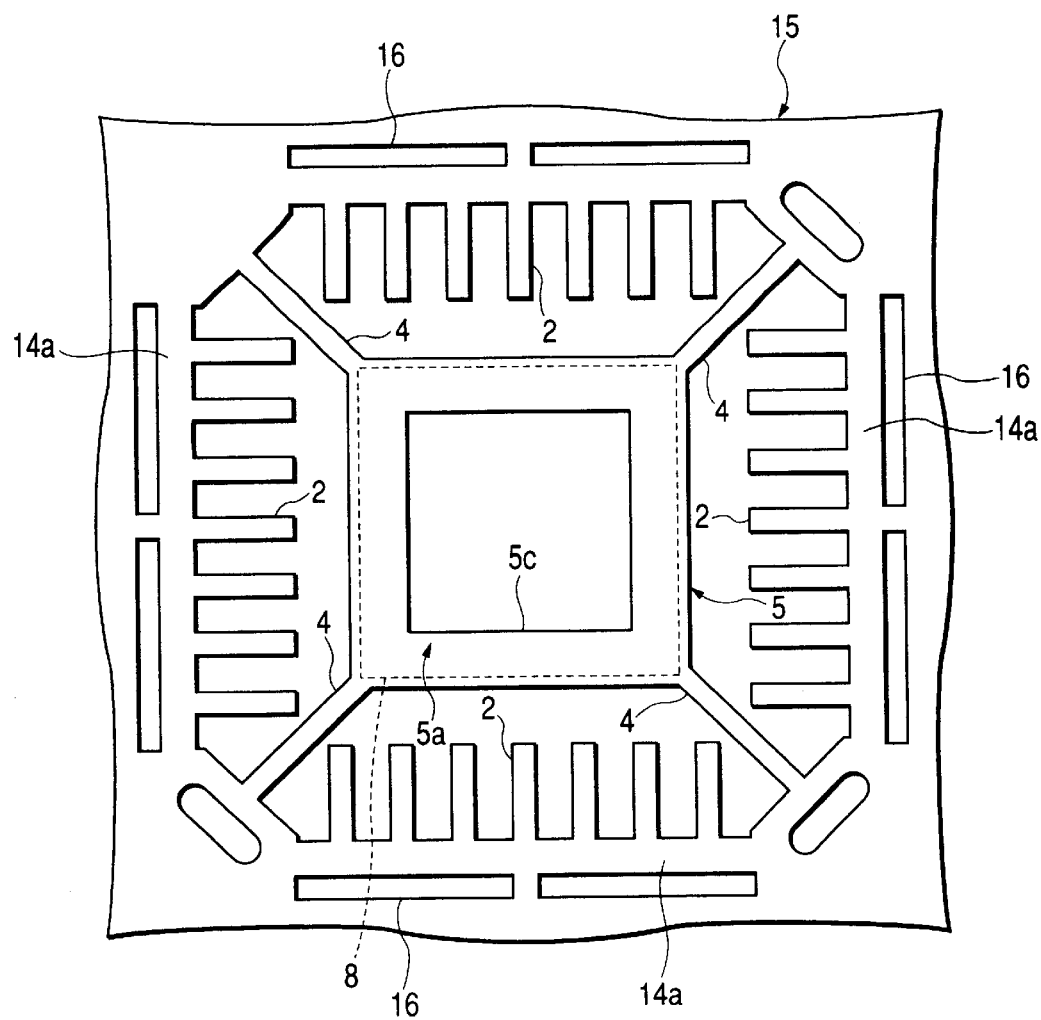
FIG. 17 is a partially magnified plan view of the configuration of a matrix frame that is an example of the modification of the matrix frame shown in FIG. 5.

Tub 5 in embodiments 1 to 3 is smaller than semiconductor chip 8; however, tub 5 may be larger than semiconductor chip 8, as in the examples of this modification that are shown in FIGS. 16 and 17.

In tub 5 that is shown in FIG. 16 as an example of a modification, chip supporting portion 5a is larger than semiconductor chip 8 and four narrow and long slit-shaped through holes 5c have been formed in a cross shape in chip supporting portion 5a.

In tub 5 that is shown in FIG. 17 as an example of a modification, chip supporting portion 5a is larger than semiconductor chip 8 and square hole 5c is formed through the center of chip supporting portion 5a, thus making chip supporting portion 5a frame-shaped.

When matrix leadframe 14 (FIG. 5) holds tubs 5 according to the examples of modification shown in FIGS. 16 and 17, the formation of hole 5c through chip-supporting portion 5a of tub 5 increases the area of contact between back surface 8b of semiconductor chip 8 and molding resin 11. It is then possible to increase the amount of molding resin 11 below tub 5.

Thus, the temperature-cycling characteristics of the semiconductor device can be improved.

As long as the shape of tub 5 for a semiconductor device that is related to this invention enables firm contact between part of back surface 8b of semiconductor chip 8 and molding resin 11 below back surface 8b, chip supporting portion 5a may be smaller or larger than semiconductor chip 8.

Although the leadframes in embodiments 1 to 3 come in matrix leadframe 14, the leadframes may also come in the form of strips in which individual leadframes 15 are located in a line.

Although the semiconductor devices in embodiments 1 to 3 are QFN1, QFN18, or QFN19, the semiconductor device may be of a type other than QFN as long as the semiconductor device is of the resin-molded type and the peripheral type which is fabricated with a leadframe.

Typical advantages obtained from the invention disclosed in this application are briefly described in the following passages.

(1) The tub and the supporting portions of the suspension leads are thinner than the exposed portions, and the supporting portions of the suspension leads are elevation processed. This reduces differences in thickness between the molded sections above and below the semiconductor chip. This improvement in the balance between the amounts of resin above and below the semiconductor chip reduces the application of stress by temperature cycling to the sections embedded below the semiconductor chip.

(2) Since part of the back surface of the semiconductor chip is firmly in contact with the molding resin, the degree of adhesion between the semiconductor chip and the molding resin on the back surface of the semiconductor chip is improved. Therefore, cracking of the package is prevented by improving the balance between the amounts of resin above and below the semiconductor chip in the above point (1) and by improving the degree of adhesion between the semiconductor chip and the molded resin on the back surface of the semiconductor chip, thus improving the temperature-cycling characteristics of the device.

(3) Forming the tub so that part of the back surface of the semiconductor chip is firmly in contact with the molded resin makes it possible to increase the amount of molded resin on the back surface of the semiconductor chip, thus improving the temperature-cycling characteristics of the device.

(4) Since the tub is smaller than the semiconductor chip, the molded section is not separated from the tub and the side and back surfaces of the semiconductor chip are firmly in contact with the resin, thus improving the temperature-cycling characteristics of the device.

(5) The tub and the supporting portion of the suspension leads are made thin, and the suspension leads are upset-processed in their supporting portions, thus obtaining a thinner semiconductor device while keeping the balance between the amounts of resin above and below the semiconductor chip.

What is claimed is:

1. A semiconductor device that is comprised of:

a chip-mounting section with major and back surfaces supporting leads with major and back surfaces, which are linked to the chip-mounting section;

leads located around the chip-mounting section;

a semiconductor chip with a major surface on which the semiconductor elements and bonding pads are formed and a back surface (opposite surface) that is made to adhere to the major surface of the chip-mounting section;

bonding wires that electrically connect the bonding pads and the leads; and resin having an upper surface and a back (opposite) surface, which is molded around the chip-mounting section, the supporting leads, the leads, the semiconductor chip and the bonding wires;

wherein parts of the leads are exposed on the back surface of the resin;

the major surface of the chip-mounting section is smaller than the back surface of the semiconductor chip;

the chip-mounting section is thinner than the leads;

each of the leads has an upper surface which is opposite from exposed portions of the leads; and the major surface of the chip-mounting section is higher than the upper surfaces of the leads.

2. A semiconductor device according to claim 1, wherein the chip mounting section is thinned by etching the back surface thereof.

* * * * *